(12) United States Patent
Wang

(10) Patent No.: US 8,248,819 B2
(45) Date of Patent: Aug. 21, 2012

(54) CHIP CARD HOLDER FOR PORTABLE ELECTRONIC DEVICE

(75) Inventor: You Wang, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 223 days.

(21) Appl. No.: 12/768,699

(22) Filed: Apr. 27, 2010

(65) Prior Publication Data

US 2011/0141709 A1    Jun. 16, 2011

(30) Foreign Application Priority Data

Dec. 15, 2009    (CN) ...................... 2009 2 0317456 U

(51) Int. Cl.
*H05K 7/14* (2006.01)
*H05K 7/18* (2006.01)

(52) U.S. Cl. ........................ 361/802; 361/807; 361/747

(58) Field of Classification Search .......... 361/800–803, 361/741, 726, 732, 740, 747, 754, 759, 807, 361/810; 292/139, 150, 207, 302; 455/575.1–575.3, 575.7

See application file for complete search history.

(56) References Cited

U.S. PATENT DOCUMENTS

| | | | |
|---|---|---|---|
| 6,888,724 B2 * | 5/2005 | Shaie | 361/719 |
| 7,086,887 B2 * | 8/2006 | Tsai et al. | 439/331 |
| 7,682,178 B2 * | 3/2010 | Feng | 439/326 |
| 7,798,858 B1 * | 9/2010 | Zuo | 439/630 |
| 7,821,793 B2 * | 10/2010 | Yin | 361/747 |
| 8,023,285 B2 * | 9/2011 | Zhu | 361/810 |
| 2005/0255753 A1 * | 11/2005 | Buschmann | 439/630 |

* cited by examiner

*Primary Examiner* — Hung S Bui
(74) *Attorney, Agent, or Firm* — Altis Law Group, Inc.

(57) ABSTRACT

A chip card holder includes a main housing and a retaining cover. The main housing includes a chip card receiving portion for receiving a chip card. The main housing defines a slot adjacent to the chip card receiving portion. A locking portion is formed adjacent to the slot. The retaining cover is rotatably attached the main housing. The retaining cover includes a latching portion. The latching portion includes an angled bottom. The retaining cover is locked to the main housing by engagement of the locking portion and the latching portion, and the angled bottom of the latching portion is received in the slot.

11 Claims, 6 Drawing Sheets

CHIP CARD HOLDER FOR PORTABLE ELECTRONIC DEVICE

BACKGROUND

1. Technical Field

The present disclosure relates to chip card holders, particularly, to a chip card holder which is used in a portable electronic device.

2. Description of Related Art

A typical chip card holder includes a body member and a cover member pivotably connected thereto. The body member defines a chip card receiving portion receiving the chip card. The cover member includes a contacting portion, a connecting portion, and a latching portion. The contacting portion connects the connecting portion to the latching portion. The latching portion has a first latching section. The body member has a second latching section corresponding to the first latching section. The cover member can be pivoted towards the body member until the first latching section interlocks with the second latching section. At this time, the contacting portion presses and holds the chip card within the chip card receiving portion and the chip card is electrically connected to a chip card connector on a printed circuit board.

However, during installation and removal of the chip card, the connecting portion can suffer from surface stress due to deformation. Thus, the connecting portion may be damaged with frequent usage.

Therefore, there is room for improvement within the art.

BRIEF DESCRIPTION OF THE DRAWINGS

Many aspects of the chip card holder can be better understood with reference to the following drawings. The components in the drawings are not necessarily drawn to scale, the emphasis instead being placed upon clearly illustrating the principles of the chip card holder, in which.

DETAILED DESCRIPTION

Figure 1:
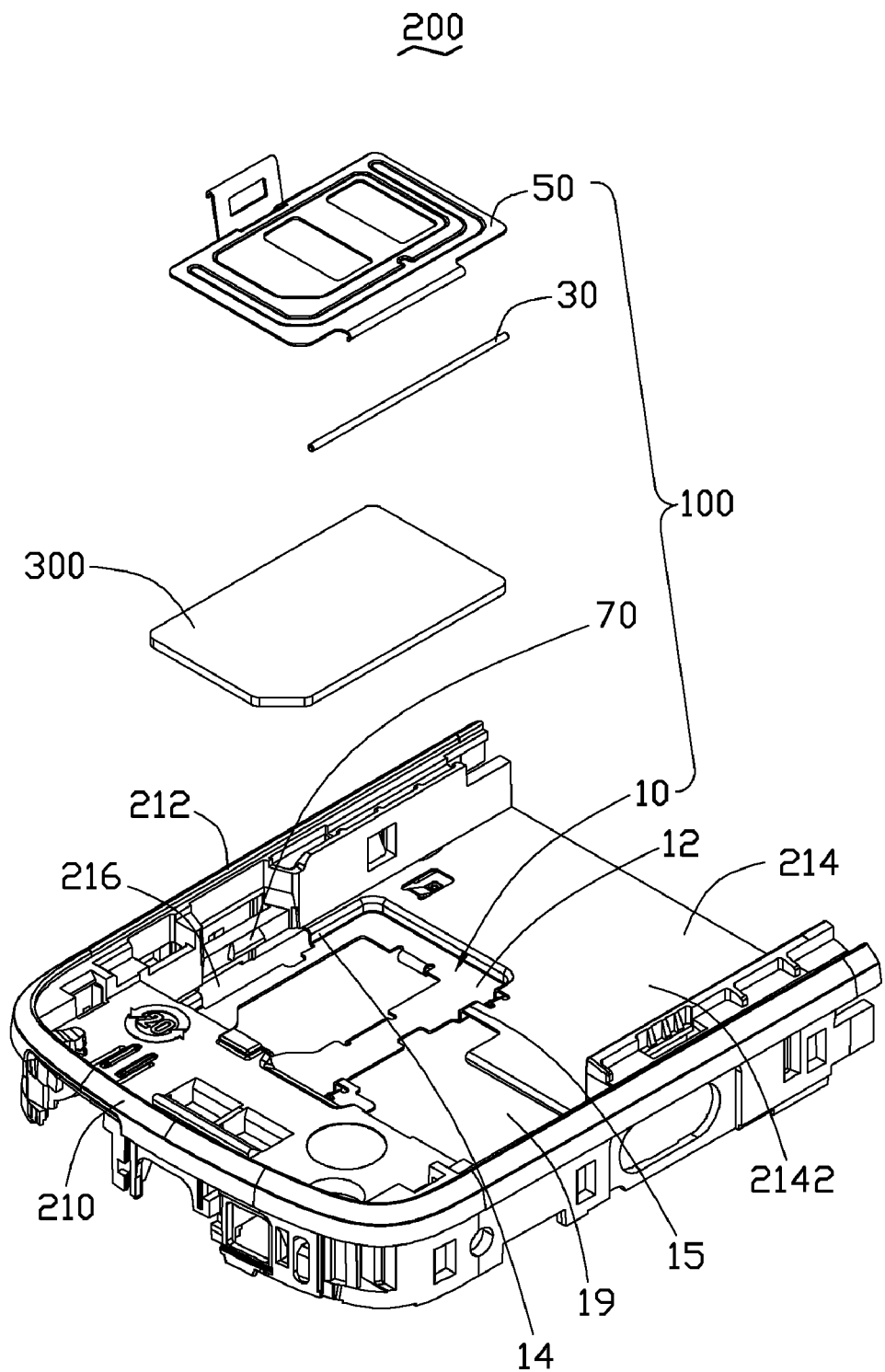
FIG. 1 is an exploded, isometric view of a chip card holder applied in a portable electronic device, in accordance with an exemplary embodiment.

FIG. 1 shows an exemplary embodiment of a portable electronic device 200 with a chip card holder 100. The device 200 includes a main housing 210 for receiving a chip card 300. The chip card holder 100 includes a chip card receiving portion 10, a shaft 30, a retaining cover 50, and a locking portion 70. The chip card receiving portion 10 and the locking portion 70 are formed on the main housing 210. The retaining cover 50 is rotatably attached to the main housing 210 by the shaft 30.

Figure 2:
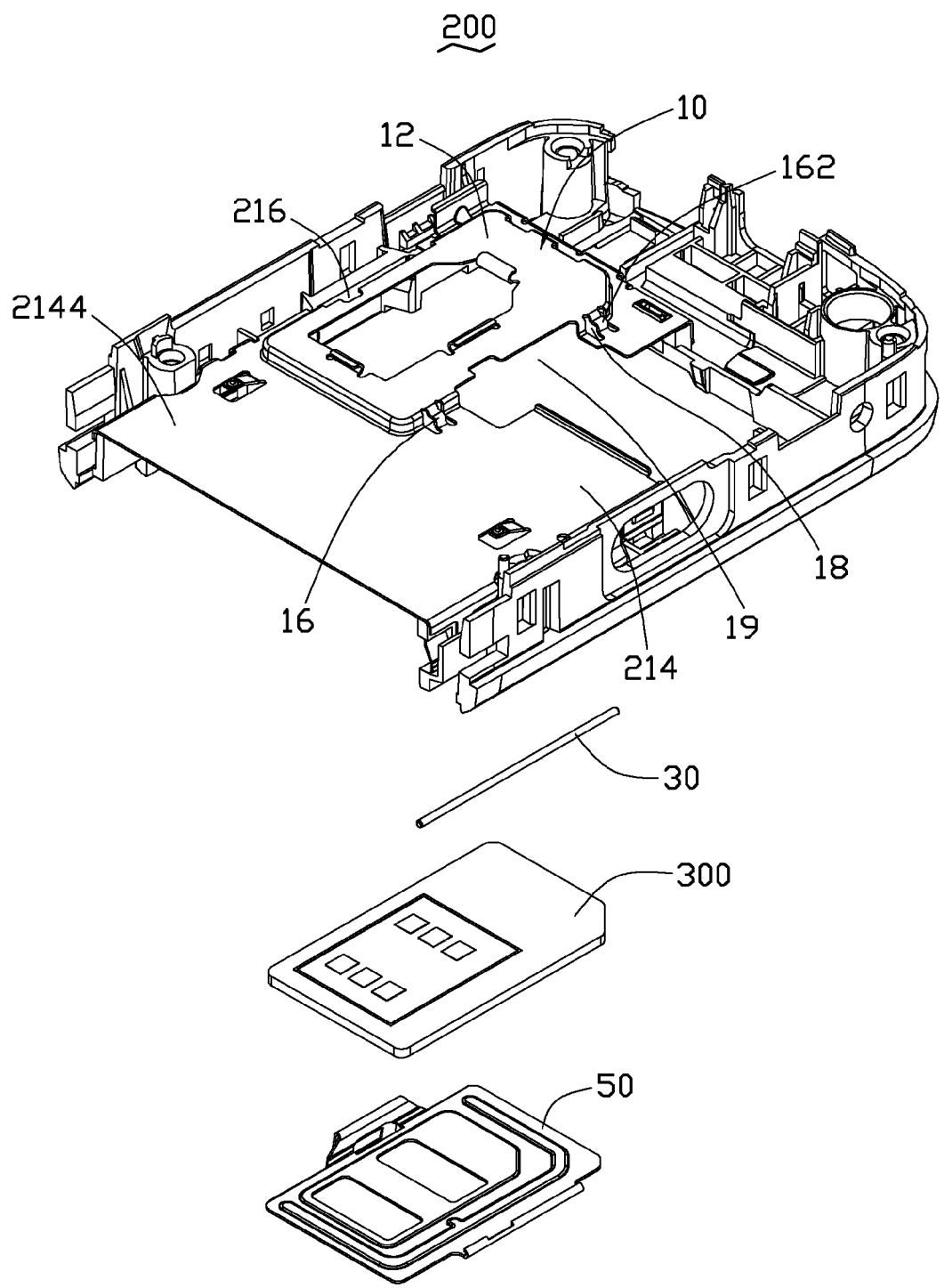
FIG. 2 is similar to FIG. 1, but shown from another aspect.

The main housing 210 includes a base 214 and a sidewall 212. Also referring to FIG. 2, the base 214 includes a first surface 2142 and an opposite second surface 2144. The chip card receiving portion 10 is positioned adjacent to the sidewall 212, and is recessed from the first surface 2142 to the second surface 2144 for receiving the chip card 300. The chip card receiving portion 10 includes a bottom wall 12, a first end wall 14, and a second end wall 15 all connected to each other. The first end wall 14 is partially cut to define a slot 216. The second end wall 15 is partially cut to define two through holes 18. The base 214 defines a cavity 19 that is bounded on one side by the second end wall 15 between the two through holes 18. Two holding arms 16 respectively extend over the through holes 18, and connect the bottom wall 12 to the first surface 2142. Each holding arm 16 includes an arcuate portion 162 for holding an end of the shaft 30 and allowing the shaft 30 to rotate. In this exemplary embodiment, the locking portion 70 is a block which protrudes from the sidewall 212 above the slot 216.

Figure 3:
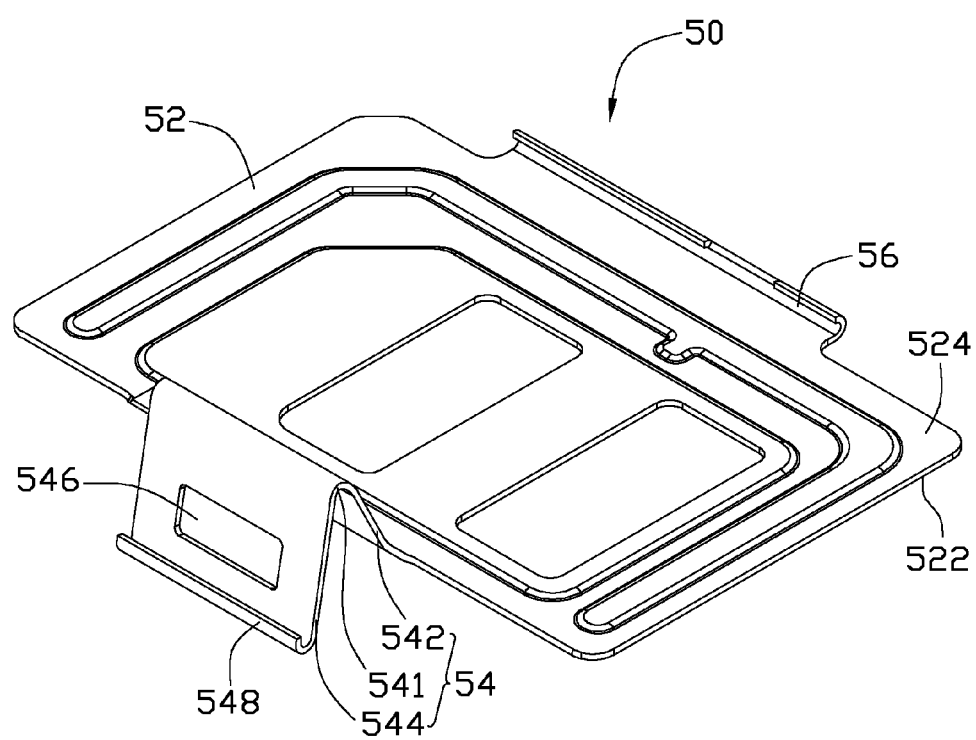
FIG. 3 is an isometric view of a retaining cover of the chip card holder shown in FIG. 1.

Referring to FIG. 3, the retaining cover 50 includes a main plate 52, a latching portion 54, and a connecting portion 56. The latching portion 54 and the connecting portion 56 are positioned at opposite sides of the main plate 52. The main plate 52 includes a first surface 522 and a second surface 524. The latching portion 54 includes a angled bottom 541. In this embodiment, the latching portion 54 includes a connecting plate 542 and an operating plate 544, and the angled bottom 541 is the intersection between the connecting plate 542 and the operating plate 544. The angled bottom 541 may be V-shaped. The connecting plate 542 extends from the second surface 524, and the operating plate 544 extends from the connecting plate 542 toward the first surface 522. The operating plate 544 is longer than the connecting plate 542, and includes a curved end 548. The operating plate 544 defines a latching hole 546 for receiving the block 70. The connecting portion 56 may have an at least partially cylindrical shape, for holding the shaft 30 and allowing the shaft 30 to rotate.

Figure 4:
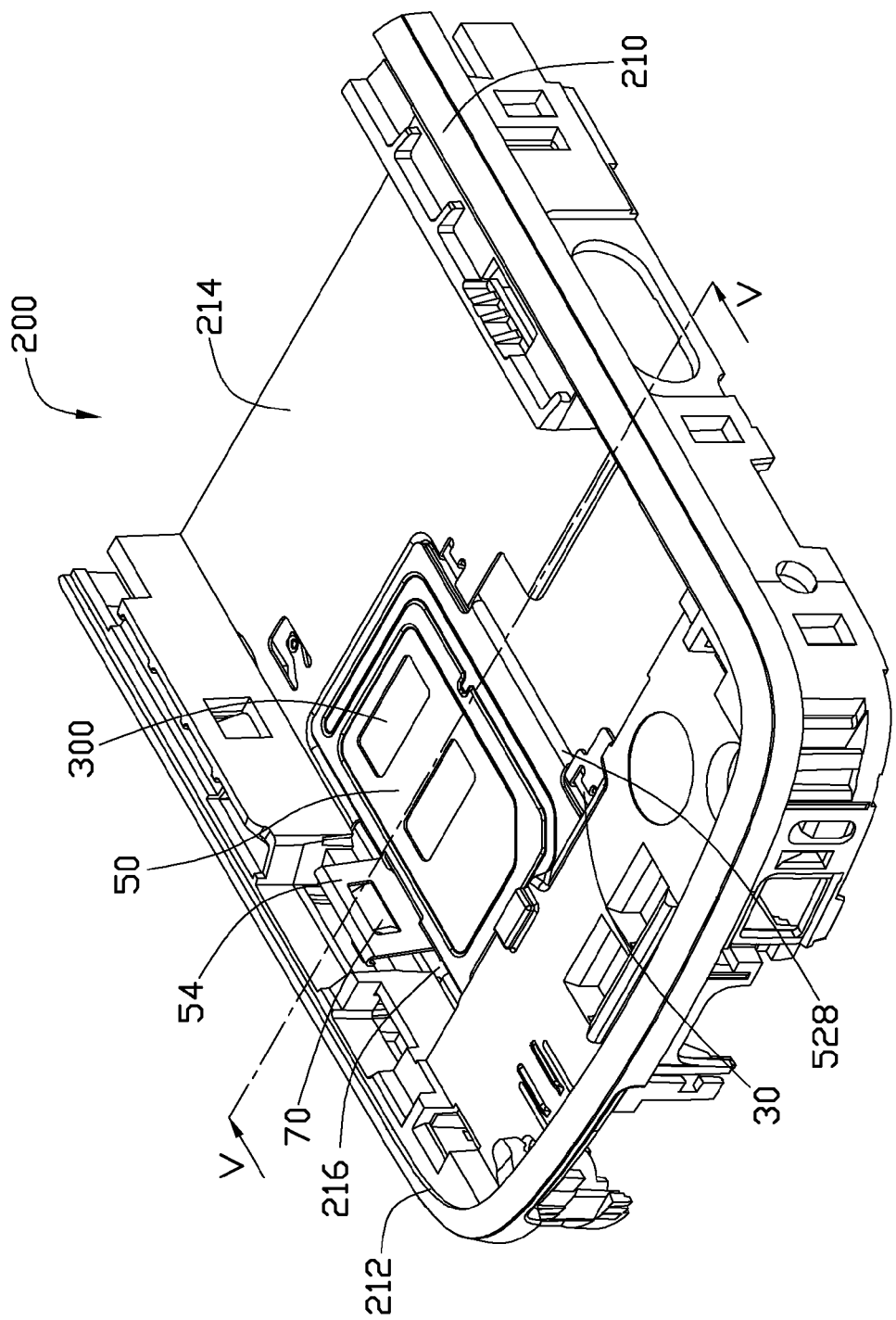
FIG. 4 is an assembled, isometric view of the chip card holder shown in FIG. 1, showing the retaining cover being in a closed state.
Figure 5:
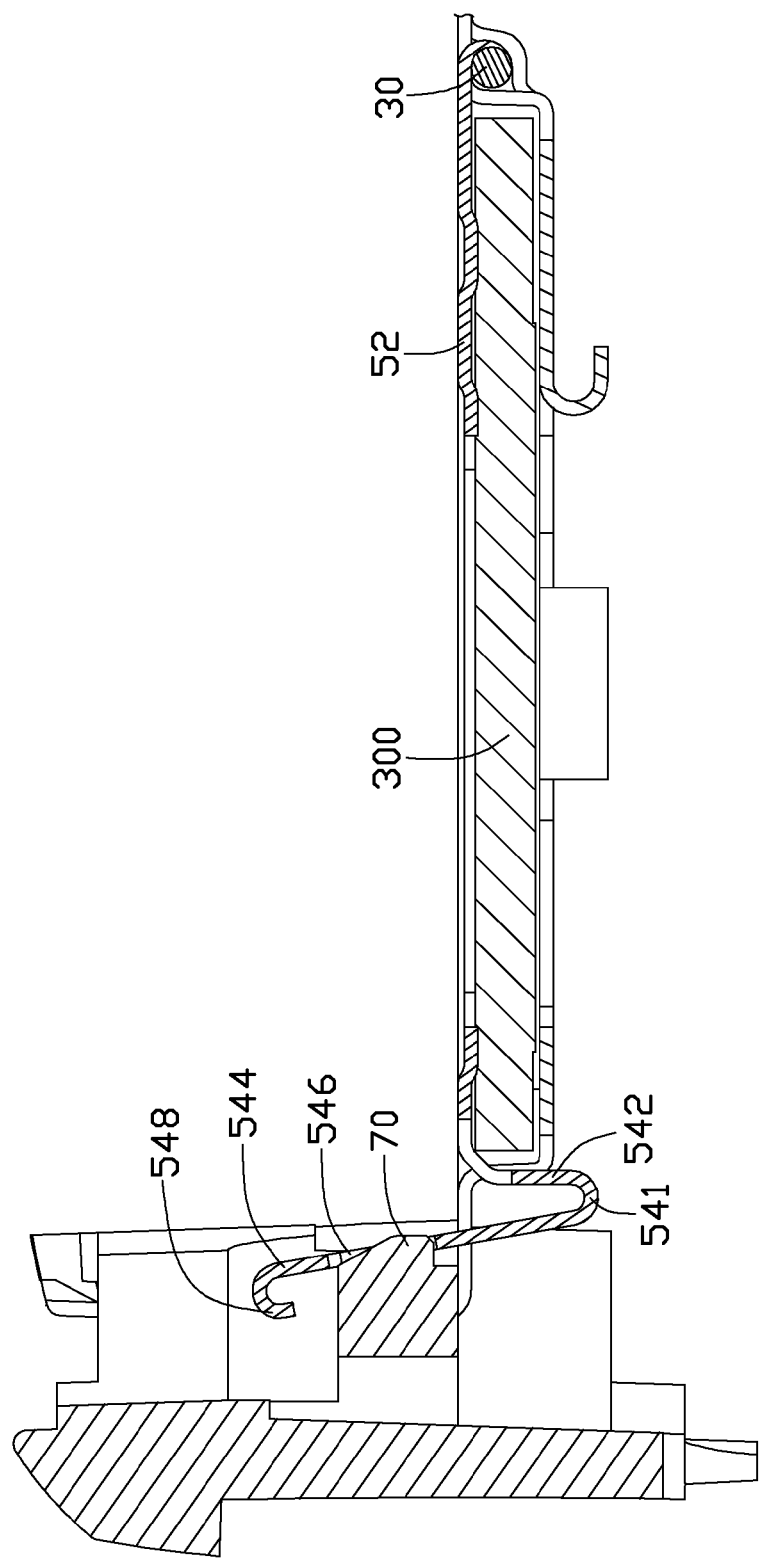
FIG. 5 is a cross-sectional view of the chip card holder along line V-V of FIG. 4.
Figure 6:
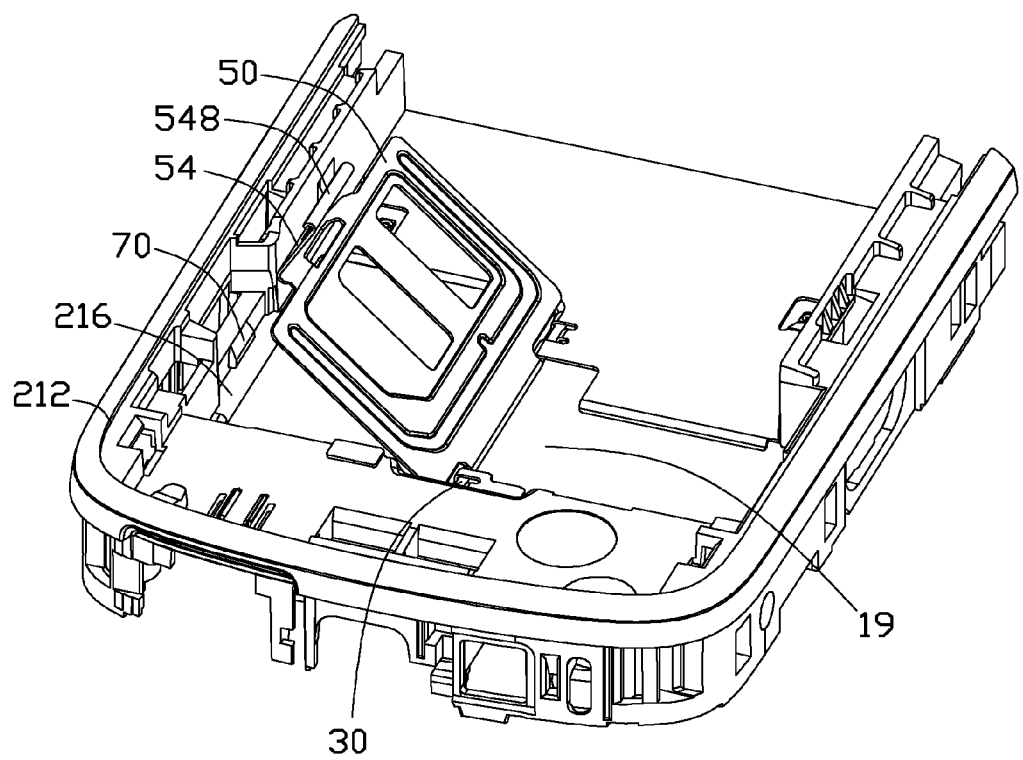
FIG. 6 is similar to FIG. 4, but showing the retaining cover being in an open state.

To attach the retaining cover 50 to the main housing 210, referring to FIGS. 4-6, the connecting portion 56 is received in the cavity 19 and is aligned with the arcuate portions 162. The shaft 30 is inserted into one of the arcuate portions 162 and extended through the connecting portion 56 and the other arcuate portion 162. Thus, the retaining cover 50 is rotatably attached to the main housing 210.

To attach the chip card 300 to the main housing 210, the retaining cover 50 is opened and the chip card 300 is received in the chip card receiving portion 10. The retaining cover 50 then is rotated toward the sidewall 212 relative to the shaft 30, and is locked on the main housing 210 by engagement between the block 70 and the latching hole 546. At this time, a portion of the latching portion 54 is received in the slot 216. This reduces the amount of space occupied by the retaining cover 50.

To remove the chip card 300 from the main housing 210, the operating plate 544 is pushed toward the main plate 52 and is disengaged from the block 70. The retaining cover 50 is then pushed and rotated relative to the shaft 30. Thus, the retaining cover 50 is open and the chip card 300 can be removed from the chip card receiving portion 10.

It is to be understood that the angled bottom of the latching portion 54 may be V-shaped and elastic. This reduces the torsion on the main plate 52 when the retaining cover 50 is being open or closed. Thus, distortion of the main plate 52 can be prevented or at least reduced, and the main plate 52 can contact the chip card 300 efficiently.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A chip card holder comprising:
a main housing including a chip card receiving portion for receiving a chip card, the main housing defining a slot adjacent to the chip card receiving portion, a locking portion being formed adjacent to the slot; and
a retaining cover rotatably attached the main housing, the retaining cover including a latching portion, the latching portion including a connecting plate, an operating plate and an angled bottom, the angled bottom being V-shaped and being an intersection between the connecting plate and the operating plate, the retaining cover being locked to the main housing by engagement of the locking portion and the latching portion, and the angled bottom of the latching portion being received in the slot.

2. The chip card holder as claimed in claim 1, wherein the locking portion including a block, and the operating plate of the latching portion defines a latching hole receiving the block.

3. The chip card holder as claimed in claim 2, wherein the main housing includes a side wall, and the block protrudes from the side wall above the slot.

4. The chip card holder as claimed in claim 1, further comprising a shaft, wherein the retaining cover further includes a connecting portion, and the connecting portion is at least partially cylindrical for holding the shaft.

5. The chip card holder as claimed in claim 4, wherein the main housing includes a base defining a cavity receiving the connecting portion, and two holding arms are formed at two sides of the cavity for holding corresponding ends of the shaft, each holding arm includes a curved portion, and opposite ends are tilted relative to the base and the chip card receiving portion.

6. A chip card holder comprising:
a main housing including a chip card receiving portion for receiving a chip card, the main housing defining a slot adjacent to the chip card receiving portion, a locking portion being formed adjacent to the slot; and
a retaining cover rotatably attached the main housing, the retaining cover including an operating plate and a connecting plate at one side, the operating plate and the connecting plate connecting each other and having a V-shaped angle bottom between each other, the retaining cover being locked to the main housing by engagement of the locking portion and the latching portion, and the V-shaped angle bottom being received in the slot.

7. The chip card holder as claimed in claim 6, wherein the locking portion including a block, and the operating plate of the latching portion defines a latching hole receiving the block.

8. The chip card holder as claimed in claim 7, wherein the main housing includes a side wall, and the block protrudes from the side wall above the slot.

9. The chip card holder as claimed in claim 8, wherein the latching portion includes a curved end.

10. The chip card holder as claimed in claim 6, further comprising a shaft, wherein the retaining cover further comprises a connecting portion, and the connecting portion is at least partially cylindrical for holding the shaft.

11. The chip card holder as claimed in claim 10, wherein the main housing includes a base defining a cavity receiving the connecting portion, and two holding arms are formed at two sides of the cavity for holding two ends of the shaft correspondingly, each holding arm includes a curved portion, and opposite ends are tilted relative to the base and the chip card receiving portion.

* * * * *